US012787581B2

(12) United States Patent
Tian et al.

(10) Patent No.: US 12,787,581 B2
(45) Date of Patent: Nov. 3, 2026

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Xuewei Tian, Beijing (CN); Changchang Liu, Beijing (CN); Liqiang Chen, Beijing (CN); Jiafan Shi, Beijing (CN); Yunpeng Zhang, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 394 days.

(21) Appl. No.: 18/692,840

(22) PCT Filed: Jul. 31, 2023

(86) PCT No.: PCT/CN2023/110110

§ 371 (c)(1),
(2) Date: Mar. 18, 2024

(87) PCT Pub. No.: WO2024/032403

PCT Pub. Date: Feb. 15, 2024

(65) Prior Publication Data

US 2024/0381722 A1 Nov. 14, 2024

(30) Foreign Application Priority Data

Aug. 9, 2022 (CN) ......................... 202210952284.9

(51) Int. Cl.
*H10K 59/131* (2023.01)
*H10K 59/80* (2023.01)
(Continued)

(52) U.S. Cl.
CPC ......... *H10K 59/131* (2023.02); *H10K 59/873* (2023.02); *H10K 77/111* (2023.02); *H10K 2102/311* (2023.02)

(58) Field of Classification Search
CPC ... G09G 2320/0219; G09G 2320/0233; G09G 3/3225; G09G 3/3233; G09G 3/3242; G09G 3/325; G09G 3/3258; H10K 59/131
See application file for complete search history.

(56) References Cited

U.S. PATENT DOCUMENTS

2021/0351259 A1* 11/2021 Lee ...................... H10K 59/131

FOREIGN PATENT DOCUMENTS

CN 108598142 A 9/2018
CN 110910823 A 3/2020
(Continued)

OTHER PUBLICATIONS

International Search Report for PCT/CN2023/110110 Mailed Nov. 13, 2023.

*Primary Examiner* — Chad M Dicke
*Assistant Examiner* — Everett T Ririe

(57) ABSTRACT

Disclosed is a display panel, comprising a display region. The display panel further comprises a first flexible substrate, a second flexible substrate, and multiple first data lines. The display panel further comprises multiple pixel driving circuits and multiple second data lines located in the display region; the multiple pixel driving circuits are arranged in an array; the multiple first data lines comprise wiring portions in the column direction of the array of the pixel driving circuits; each pixel driving circuit comprises a driving transistor; and the orthographic projection of at least the wiring portions of the multiple first data lines in the column direction of the array of the pixel driving circuits on the first flexible substrate does not overlap with the orthographic
(Continued)

E-E′ projection of channel regions of the driving transistors on the first flexible substrate.

20 Claims, 12 Drawing Sheets

(51) Int. Cl.
*H10K 77/10* (2023.01)
*H10K 102/00* (2023.01)

(56) References Cited

FOREIGN PATENT DOCUMENTS

| | | | |
|---|---|---|---|
| CN | 111681549 | A | 9/2020 |
| CN | 114122055 | A | 3/2022 |
| CN | 114188351 | A | 3/2022 |
| CN | 114373774 | A | 4/2022 |
| CN | 115294936 | A | 11/2022 |

* cited by examiner

DISPLAY PANEL AND DISPLAY DEVICE

CROSS-REFERENCE TO RELATED APPLICATIONS

The present application is a U.S. National Phase Entry of International Application No. PCT/CN2023/110110 having an international filing date of Jul. 31, 2023, which claims priority to Chinese Patent Application No. 202210952284.9, filed to the CNIPA on Aug. 9, 2022. The entire contents of the above-identified applications are hereby incorporated by reference.

TECHNICAL FIELD

The present disclosure relates to the field of display technologies, and specifically to a display panel and a display apparatus.

BACKGROUND

In recent years, development of full screen is very rapid, which puts forward new requirements for a form of a screen. A display screen is moving towards an era of full screen. In order to increase a screen-to-body ratio, narrow border products have attracted more and more attention.

SUMMARY

In a first aspect, an embodiment of the present disclosure provides a display panel, including a display region; wherein the display panel further includes a first flexible substrate, a second flexible substrate, and a plurality of first data lines, the plurality of first data lines are located between the first flexible substrate and the second flexible substrate that are stacked; the plurality of first data lines are distributed in the display region; the display panel further includes a plurality of pixel drive circuits and a plurality of second data lines located in the display region, and the plurality of pixel drive circuits and the plurality of second data lines are located on a side of the second flexible substrate facing away from the first data lines; the plurality of pixel drive circuits are arranged in an array; the plurality of first data lines are connected with the plurality of second data lines in one-to-one correspondence; wherein the plurality of first data lines include a part routing along a column direction of the pixel drive circuit array, the pixel drive circuits include drive transistors, and an orthographic projection of at least the part of the plurality of first data lines routing along the column direction of the pixel drive circuit array on the first flexible substrate is not overlapped with an orthographic projection of channel regions of the drive transistors on the first flexible substrate.

In some embodiments, the display region includes a first region and a second region, wherein the first region and the second region are connected; the display panel further includes a non-display region, the non-display region includes a bending region located on a side of the first region away from the second region, and the bending region, the first region, and the second region are arranged in sequence along a second direction; the second direction is the column direction of the pixel drive circuit array; the first region includes a first sub-region, a second sub-region, and a third sub-region, wherein the first sub-region, the second sub-region, and the third sub-region are sequentially arranged along a first direction and connected with each other; the first direction is a row direction of the pixel drive circuit array; the bending region is connected with the second sub-region; the first flexible substrate, the plurality of first data lines, and the second flexible substrate extend from the second sub-region to the bending region; the plurality of first data lines within the second sub-region include a first portion, a second portion, and a third portion; the first portion, the second portion, and the third portion are arranged in sequence along the first direction; the first portion extends and is distributed from the second sub-region to the first sub-region, the third portion extends and is distributed from the second sub-region to the third sub-region, and the second portion extends and is distributed from the second sub-region to the second region.

In some embodiments, the first portion, the second portion, and the third portion distributed within the second sub-region extend along the second direction, and any two adjacent first data lines are symmetrically distributed on opposite sides of a channel region of one of the drive transistors; within the second sub-region, two of the first data lines are distributed within a region of an orthographic projection of any one of the pixel drive circuits on the first flexible substrate.

In some embodiments, the first sub-region includes a first partition and a second partition; the third sub-region includes a first partition and a second partition; the first partition and the second partition are sequentially arranged along the first direction and connected with each other; the second partition is located on a side of the first partition away from the second sub-region; the first portion extends and is distributed to the first partition of the first sub-region; the third portion extends and is distributed to the first partition of the third sub-region; the first portion includes a plurality of the first data lines; the third portion includes a plurality of the first data lines.

In some embodiments, the first portion and the third portion distributed within the first partition extend along the first direction, and a first data line is located between two adjacent rows of the pixel drive circuits; within the first partition, two first data lines are distributed between any two adjacent rows of the pixel drive circuits; and an orthographic projection of the first data lines and an orthographic projection of channel regions of switching transistors in the pixel drive circuits on the first flexible substrate are not overlapped.

In some embodiments, a plurality of redundant traces are further included, and are located within the first partition and arranged in an array; the plurality of redundant traces extend along the second direction, and any two adjacent redundant traces along the first direction are symmetrically distributed on opposite sides of a channel region of one of the drive transistors; within the first partition, two of the redundant traces are distributed within a region of an orthographic projection of any one of the pixel drive circuits on the first flexible substrate; each row of the redundant traces is connected with one of the first data lines extending along the first direction; an orthographic projection of each row of the redundant traces and an orthographic projection of other first data lines extending along the first direction on the first flexible substrate are not overlapped; a length of each of the redundant traces does not exceed a length of a region of an orthographic projection of a pixel drive circuit on the first flexible substrate along the second direction.

In some embodiments, the first portion further extends and is distributed to the second partition of the first sub-region; the third portion further extends and is distributed to the second partition of the third sub-region.

In some embodiments, the first portion and the third portion distributed within the second partition extend along the second direction, and any two adjacent first data lines along the first direction are symmetrically distributed on opposite sides of a channel region of one of the drive transistors; within the second partition, two of the first data lines are distributes within a region of an orthographic projection of any one of the pixel drive circuits on the first flexible substrate.

In some embodiments, a width of a connection part of the first region and the second region is equal to a width of the second region along the first direction; the first portion further extends and is distributed to the second region; the third portion further extends and is distributed to the second region.

In some embodiments, the first portion, the second portion, and the third portion distributed within the second region are sequentially arranged along the first direction, and the first portion, the second portion, and the third portion respectively extend along the second direction; the plurality of second data lines are sequentially arranged along the first direction, and the plurality of second data lines extend along the second direction; within the second region, one of the first data lines is distributed within a region of an orthographic projection of any one of the pixel drive circuits on the first flexible substrate; and orthographic projections of the plurality of first data lines and the plurality of second data lines on the first flexible substrate are overlapped in one-to-one correspondence.

In some embodiments, the non-display region further includes an upper frame region located on a side of the second region away from the first region, and the upper frame region is connected with the second region; the first flexible substrate, the plurality of first data lines, and the second flexible substrate further extend from the second region to the upper frame region; the pixel drive circuits include a first conductive layer and a second conductive layer, wherein the first conductive layer and the second conductive layer are sequentially disposed away from the second flexible substrate; an insulation layer is disposed between the first conductive layer and the second conductive layer; the first conductive layer includes a plurality of first patterns, and an orthographic projection of the plurality of first patterns on the first flexible substrate extends from the upper frame region to the second region; the plurality of first data lines located within the upper frame region are respectively connected with the plurality of first patterns in one-to-one correspondence through first vias opened in the second flexible substrate; the second conductive layer includes the plurality of second data lines; the plurality of first patterns located within the second region are respectively connected with the plurality of second data lines in one-to-one correspondence through second vias opened in the insulation layer.

In some embodiments, a plurality of light emitting units and an encapsulation layer are further included, the plurality of light emitting units are located in the display region and on a side of the pixel drive circuits facing away from the second flexible substrate; the plurality of light emitting units are arranged in an array, and the plurality of light emitting units are connected with the plurality of pixel drive circuits in one-to-one correspondence; the encapsulation layer is located on a side of a light emitting unit facing away from the pixel drive circuit, and is used for encapsulating the light emitting unit; an upper boundary of the encapsulation layer is located in the upper frame region; an orthographic projection of the first vias and an orthographic projection of the encapsulation layer on the first flexible substrate are not overlapped.

In some embodiments, the first conductive layer further includes a plurality of second patterns located in the display region, and the plurality of second patterns are each used as one electrode plate of a storage capacitor in each of the pixel drive circuits; an orthographic projection of the second patterns and an orthographic projection of the plurality of first data lines on the first flexible substrate are not overlapped.

In a second aspect, an embodiment of the present disclosure further provides a display apparatus including the above display panel.

BRIEF DESCRIPTION OF DRAWINGS

Accompanying drawings are used to provide a further understanding of embodiments of the present disclosure, and constitute a part of the specification. They are used together with the embodiments of the present application to explain the present disclosure, and do not constitute limitations on the present disclosure. The above and other features and advantages will become more apparent to those skilled in the art by describing detailed exemplary embodiments with reference to the accompanying drawings.

DETAILED DESCRIPTION

Figure 1A:
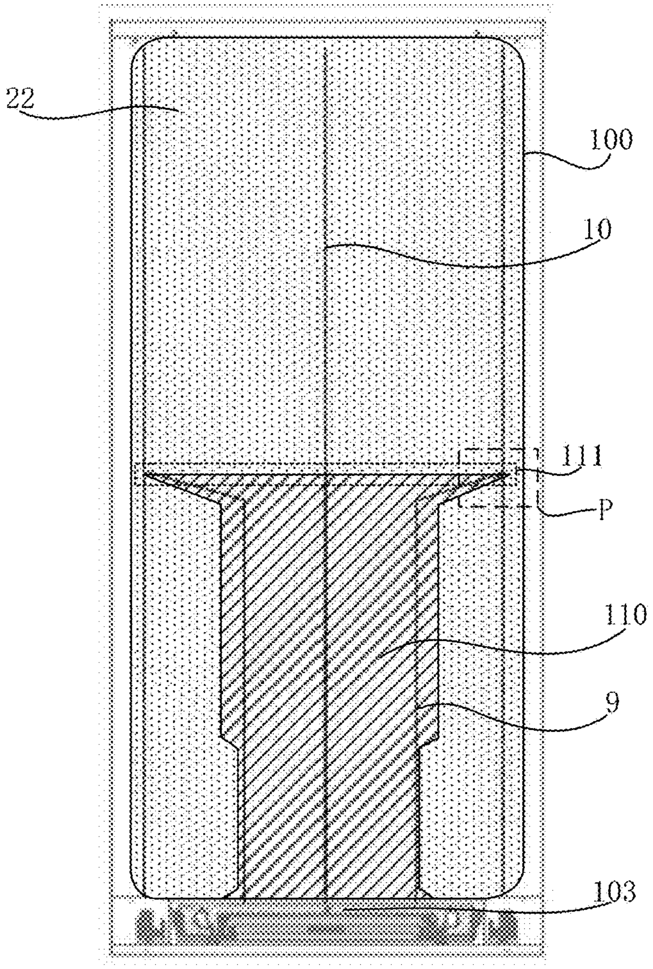
FIG. 1*a* is a schematic top view of a structure in which a fan-shaped trace region of a display panel is disposed in a display region in an embodiment of the present disclosure.

In order to enable those skilled in the art to better understand technical solutions of the embodiments of the present disclosure, a display panel and a display apparatus provided by the embodiments of the present disclosure will be further described in detail in combination with the accompanying drawings and specific implementation modes.

The embodiments of the present disclosure will be described more fully hereinafter with reference to the accompany drawings, but illustrated embodiments may be embodied in different forms and should not be construed as being limited to the embodiments set forth in the present disclosure. On the contrary, these embodiments are provided for a purpose of making the present disclosure thorough and complete, and those skilled in the art will be enabled to fully understand the scope of the present disclosure.

The embodiments of the present disclosure are not limited to embodiments shown in the drawings, but include modifications of configurations formed based on manufacturing processes. Therefore, regions illustrated in the drawings have schematic properties, and shapes of the regions shown in the drawings illustrate specific shapes of the regions, but are not intended to be restrictive.

Hereafter, terms “first” and “second” are only used for descriptive purposes and cannot be understood as indicating or implying relative importance or implicitly indicating a quantity of indicated technical features. Therefore, features defined by “first” and “second” may explicitly or implicitly include one or more such features. In the description of the present disclosure, “plurality/multiple” means two or more than two, unless otherwise specified.

In the related art, a display panel usually has a fan-shaped trace region (Fanout trace region), which is located in a non-display region, and is used for leading out a data signal line from a drive terminal to a display region to provide a corresponding data signal for a pixel drive circuit in the display region. However, this design mode in the related art will significantly increase a size of a lower border, which is not conducive to realization of an extremely narrow border.

To solve the above problems, in a first aspect, an embodiment of the present disclosure provides a display panel, referring to FIG. 1*a*, which is a schematic top view of a structure in which a fan-shaped trace region of a display panel is disposed in a display region in an embodiment of the present disclosure. The fan-shaped trace region of the display panel may be disposed in the display region, and a fan-shaped trace region 110 of the display panel (i.e., a fanout trace region, i.e., a divergent trace region like a bell mouth) is disposed in a display region 100, which facilitates realization of an extremely narrow border of the display panel. The fan-shaped trace region 110 is disposed in the display region 100, which may be achieved by adding a layer of metal trace (i.e., a Source-Drain (SD) 0 layer trace 9) to a bottom layer of a backplane of the display region 100 of the display panel. The SD0 layer trace 9 introduces a display data signal of the display panel from a bending region 103 outside the display region 100 (bent to a back of the display panel so as to be bonded and connected with a peripheral circuit located at the back of the display panel) to the display region 100. In the display region 100, the SD0 layer trace 9 achieves fan-shaped expansion to connect the display data signal into each data line 10, and the data line 10 inputs the display data signal into each column of pixels, thereby achieving display of each column of pixels.

Figure 1B:
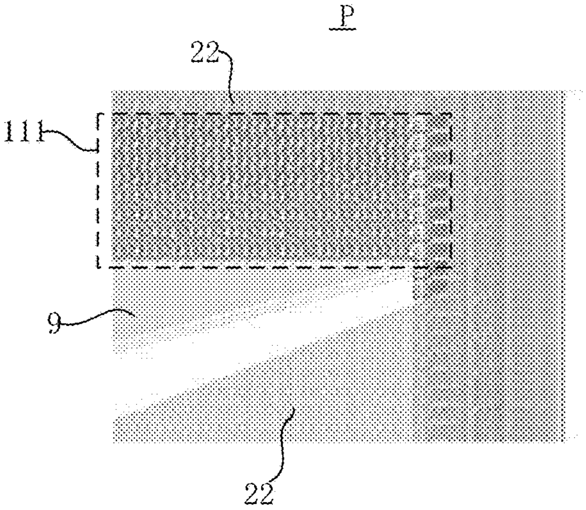
FIG. 1*b* is an enlarged schematic view of a position P in FIG. 1*a*.
Figure 1C:
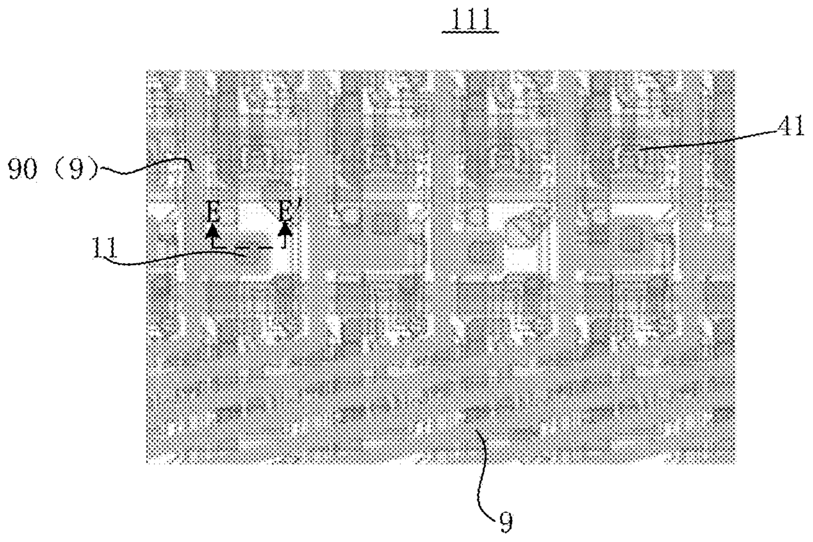
FIG. 1*c* is a further enlarged view of a front of a display data signal access region is shown in FIG. 1*b*.
Figure 1D:
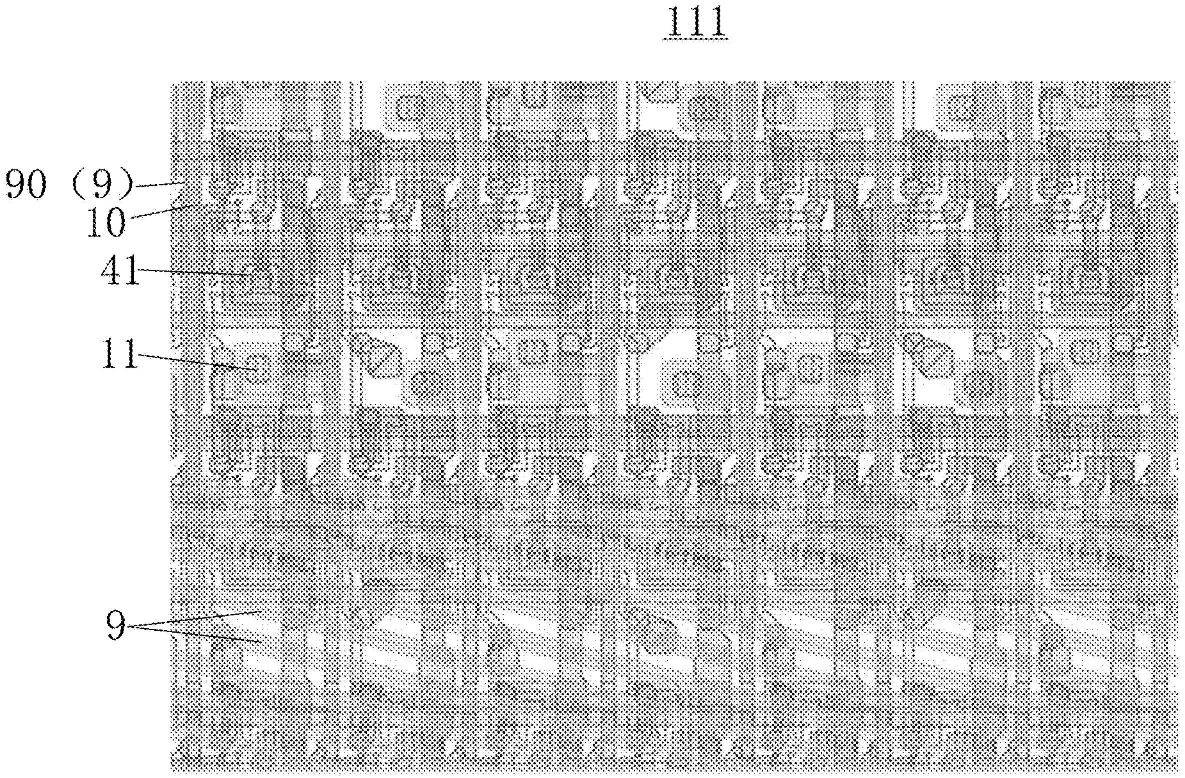
FIG. 1*d* is a further enlarged view of a back of the display data signal access region in FIG. 1*b*.

Referring to FIG. 1*a*, in order to ensure that a display data signal transmitted by a data line is similar when being close to a drive end and being far away from the drive end, an access region 111 of the display data signal (i.e., a connection region between the SD0 layer trace and the data line) is designed in a region where middle row pixels along an extension direction of the data line 10, of the display region 100 are located. Assuming that M rows of pixels are disposed within the display region 100, a region where middle row pixels are located may be a region where one middle row of pixels are located, such as a region where a M/2-th (which is an integer) row of pixels are located, or a region where middle multiple rows of pixels are located, such as a region where a (M/2−2)-th (which is an integer) row of pixels, a (M/2−1)-th (which is an integer) row of pixels, a M/2-th (which is an integer) row of pixels, and a (M/2+1)-th (which is an integer) row of pixels are located. Referring to FIGS. 1*b*, 1*c*, and 1*d*, FIG. 1*b* is an enlarged schematic view of a position P in FIG. 1*a*; FIG. 1*c* is a further enlarged view of a front of a display data signal access region in FIG. 1*b*; FIG. 1*d* is a further enlarged view of a back of the display data signal access region in FIG. 1*b*; as may be seen from FIGS. 1*c* and 1*d*, a connection between a SD0 layer trace 9 located at a bottom layer and a data line 10 (the data line 10 is covered by the SD0 layer trace 9) is achieved through a via 11.

Figure 1E:
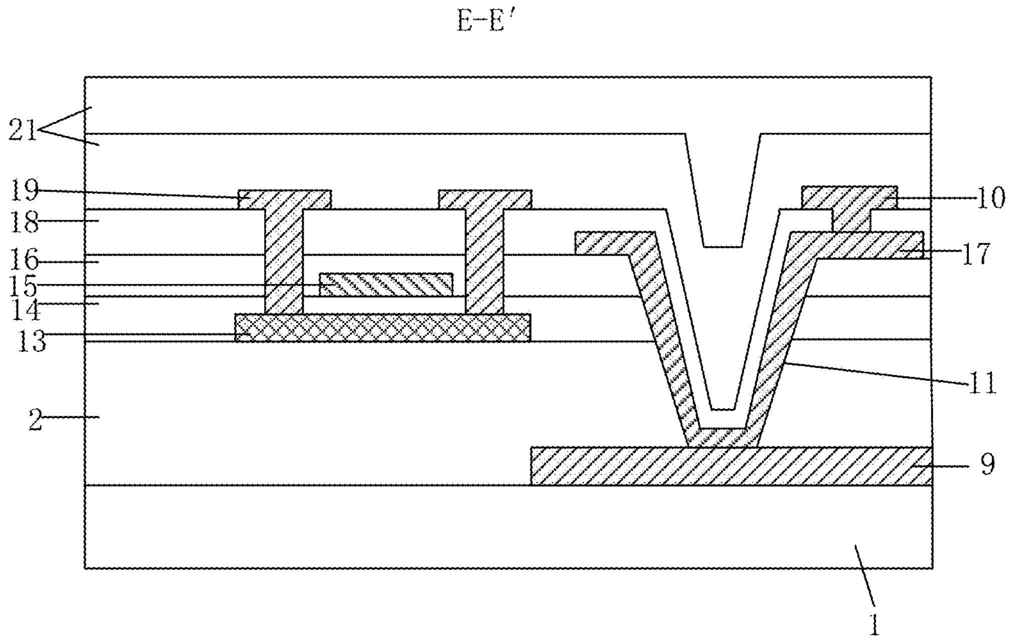
FIG. 1*e* is a sectional view of a structure taken along a section line EE' in FIG. 1*c*.

In some embodiments, referring to FIG. 1*e*, it is a sectional view of a structure taken along a section line EE' in FIG. 1*c*. In fact, only a cross-sectional structure of the via 11 can be shown on a sectional plane along the section line EE' in FIG. 1*c*, and in order to explain a position of each film layer of a transistor in a pixel drive circuit, the position of each film layer of the transistor is also schematically shown in FIG. 1*e*. Within the display region 100, a first flexible substrate 1, an SD0 layer trace 9, and a second flexible substrate 2 are stacked in sequence, and an active layer 13, a first gate insulation layer 14, a first gate layer 15, a second gate insulation layer 16, a second gate layer 17, an intermediate dielectric layer 18, an SD1 conductive layer 19, and a planarization layer 21 are disposed on a side of the second flexible substrate 2 facing away from the SD0 layer trace 9; the active layer 13, the first gate insulation layer 14, the first gate layer 15, the second gate insulation layer 16, the second gate layer 17, the intermediate dielectric layer 18, the SD1 conductive layer 19, and the planarization layer 21 are disposed in sequence away from the second flexible substrate 2. In a region where middle row pixels where the access region 111 of the display data signal is located are located, the data line 10 is located in the SD1 conductive layer 19; the SD0 layer trace 9 is connected with the second gate layer 17 through a via opened in the second flexible substrate 2, the first gate insulation layer 14, and the second gate insulation layer 16; the second gate layer 17 is connected with the data line 10 located in the SD1 conductive layer 19 through a via opened in the intermediate dielectric layer 18; thus, a connection between the SD0 layer trace 9 and the data line 10 is achieved. The via opened in the second flexible substrate 2, the first gate insulation layer 14, and the second gate insulation layer 16 and the via opened in the intermediate dielectric layer 18 together constitute the via 11 for achieving the connection between the SD0 layer trace 9 and the data line 10.

In some embodiments, referring to FIGS. 1*b* 1*c*, and 1*d*, a range of the access region 111 of the display data signal may be a region where middle 3 to 4 rows of pixels are located. In a region where any one middle row of pixels where the access region 111 of the display data signal is located are located, vias 11 for achieving connections between a plurality of SD0 layer traces 9 and a plurality of data lines 10 in one-to-one correspondence are not in one straight line, because a setting position of each via 11 needs to avoid being overlapped with another conductive film layer except the second gate layer in an orthographic projection direction; however, setting positions of various conductive film layers within various pixel regions are different, so in the region where any one middle row of pixels where the access region 111 of the display data signal is located are located, vias 11 for achieving connections between a plurality of SD0 layer traces 9 and a plurality of data lines 10 in one-to-one correspondence are not in one straight line.

In some embodiments referring to FIGS. 1*a* and 1*b*, the display panel further includes a reference power supply trace 22 located in the display region 100; the reference power supply trace 22 and a SD0 layer trace 9 are located in a same layer, the reference power supply trace 22 is located in a region other than a region of distribution of the SD0 layer traces 9, and the two are insulated from each other; the reference power supply trace 22 is grid-shaped, and the grid-shaped reference power supply trace 22 is all over a region other than a region of distribution of the SD0 layer traces 9 within the display region 100. The display panel further includes an anode layer, a pixel definition layer, a light emitting functional layer, and a cathode layer, wherein the anode layer, the pixel definition layer, and the cathode layer are stacked on the planarization layer in sequence; an opening is disposed in the pixel definition layer, and the light emitting functional layer is located in the opening; the reference power supply trace 22 is connected with the cathode layer through a connection lead in a peripheral border region around the display region 100 so as to provide a reference power supply for the cathode layer; in this way, load and power consumption of the display panel can be reduced.

Figure 2:
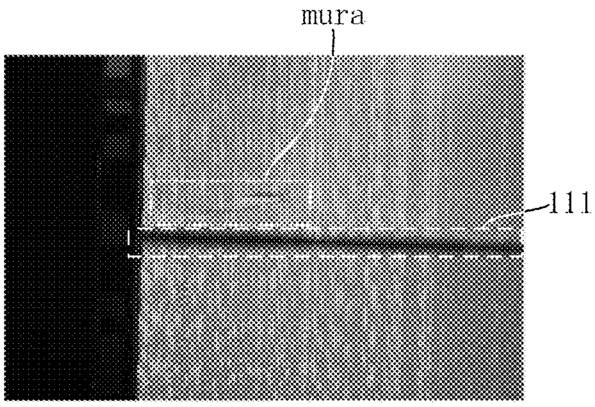
FIG. 2 is a schematic diagram of a display panel in which mura lines appear in a lighting test through a pixel drive circuit.
Figure 3:
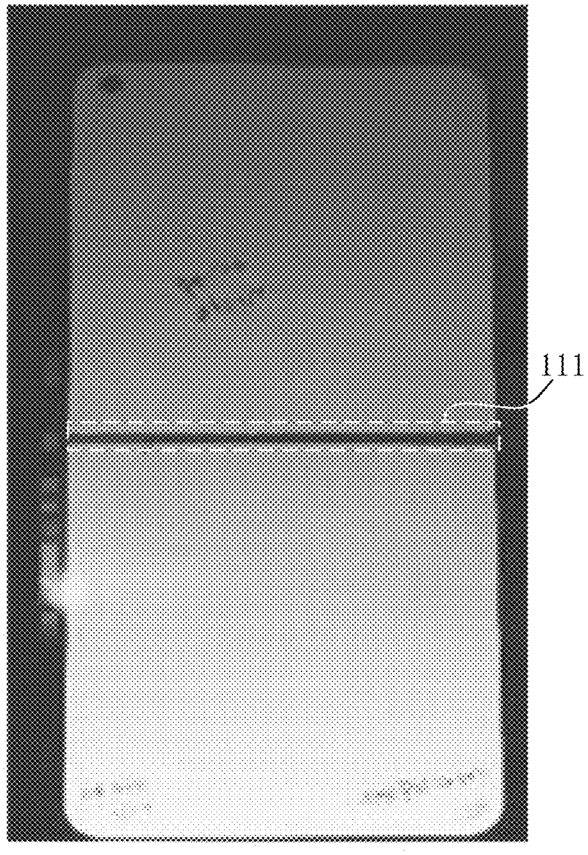
FIG. 3 is a schematic diagram of a display panel in which a mura phenomenon does not appear when an Organic Light Emitting Diode (OLED) light emitting unit is lit without driving a pixel circuit.

Referring to FIG. 2, which is a schematic diagram of the display panel in which mura lines appear in a lighting test through a pixel drive circuit; referring to FIG. 3, which is a schematic diagram of a display panel in which a mura phenomenon does not appear when an Organic Light Emitting Diode (OLED) light emitting unit is lit without driving a pixel circuit; it may be determined from test results in FIGS. 2 and 3 that appearance of mura lines is not caused by unevenness of an anode of the OLED light emitting unit, but since the SD0 layer trace is irregularly disposed below a channel region of a drive transistor of the pixel drive circuit, the channel region of the drive transistor is uneven, which in sequence leads to a change of a width-length ratio of the channel region of the drive transistor, so that a drive current of the drive transistor changes, and finally leads to the mura phenomenon.

In order to solve the above problem of a mura defect, an embodiment of the present disclosure provides a display panel, referring to FIGS. 1*c*, 1*d*, and 1*e*, the display panel includes a display region 100; the display panel further includes a first flexible substrate 1, a second flexible substrate 2, and a plurality of first data lines (i.e., the SD0 layer traces 9), and the plurality of first data lines are located between the first flexible substrate 1 and the second flexible substrate 2 that are stacked; the plurality of first data lines are distributed in the display region 100; the display panel further includes a plurality of pixel drive circuits and a plurality of second data lines (i.e., data lines 10 located in the SD1 conductive layer) located in the display region 100, and the plurality of pixel drive circuits and the plurality of second data lines are located on a side of the second flexible substrate 2 facing away from the first data lines; the plurality of pixel drive circuits are arranged in an array; the plurality of first data lines are connected with the plurality of second data lines in one-to-one correspondence; among them, the plurality of first data lines include a part 90 routing along a column direction of the pixel drive circuit array, a pixel drive circuit includes a drive transistor, and an orthographic projection of the part 90 of the plurality of first data lines routing along the column direction of the pixel drive circuit array on the first flexible substrate 1 is not overlapped with an orthographic projection of a channel region 41 of the drive transistor on the first flexible substrate 1.

Figure 4:
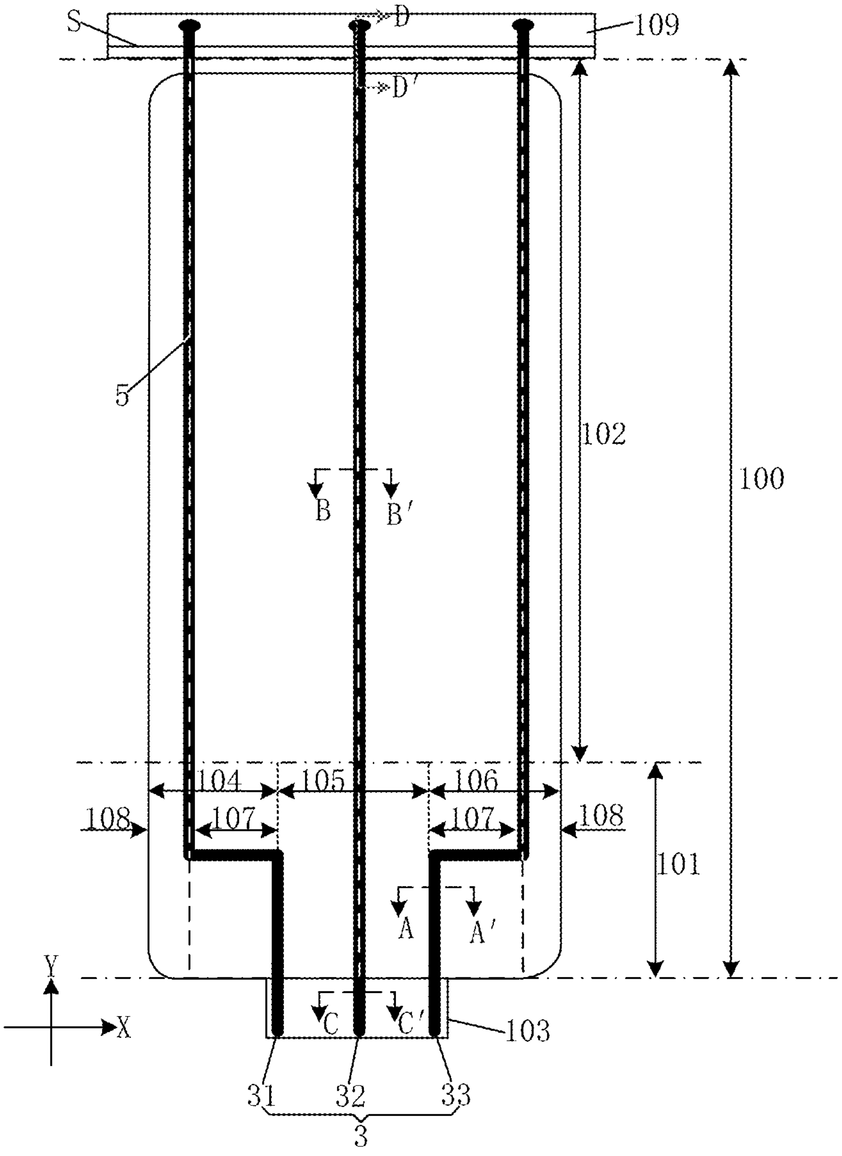
FIG. 4 is a schematic top view of a structure of a display side of another display panel in an embodiment of the present disclosure.
Figure 5:
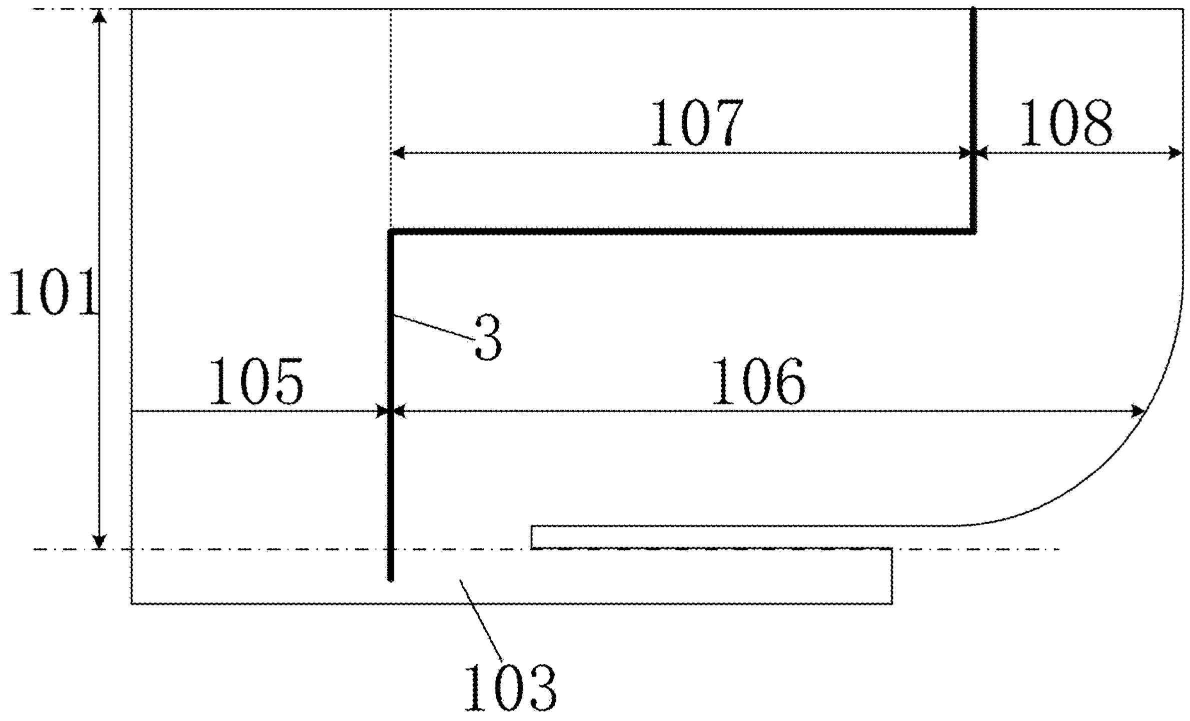
FIG. 5 is a partially enlarged schematic view of a first region in FIG. 4.
Figure 6:
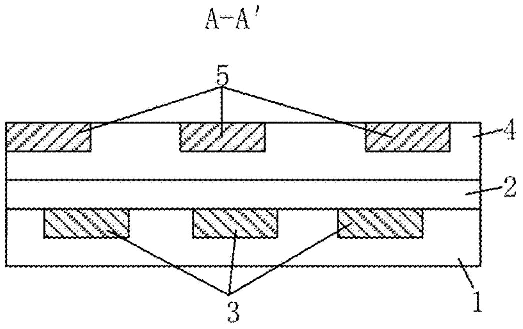
FIG. 6 is a sectional view of a structure taken along a section line AA' in FIG. 4.
Figure 7:
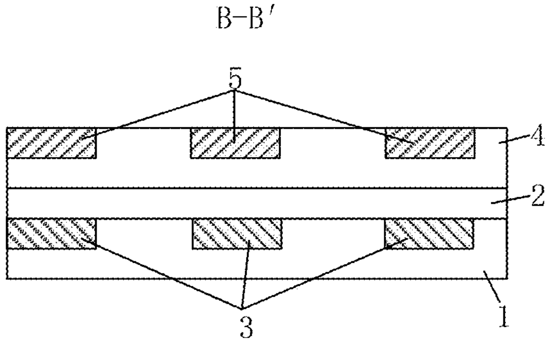
FIG. 7 is a sectional view of a structure taken along a section line BB' in FIG. 4.
Figure 8:
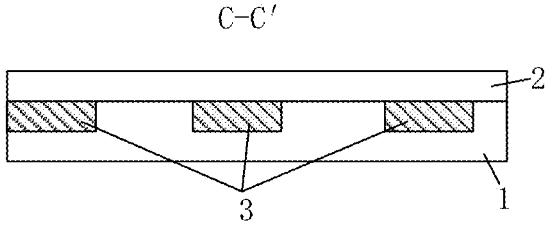
FIG. 8 is a sectional view of a structure taken along a section line CC' in FIG. 4.

In order to solve the above problem of a mura defect, an embodiment of the present disclosure provides another display panel referring to FIG. 4, which is a schematic plan view of a structure of a display side of another display panel in the embodiment of the present disclosure; FIG. 5 is a partially enlarged schematic view of a first region in FIG. 4; FIG. 6 is a sectional view of a structure taken along a section line AA' in FIG. 4; FIG. 7 is a sectional view of a structure taken along a section line BB' in FIG. 4; FIG. 8 is a sectional view of a structure taken along a section line CC' in FIG. 4; the display panel includes a display region 100; the display panel further includes a first flexible substrate 1, a second flexible substrate 2, and a plurality of first data lines 3, and the plurality of first data lines 3 are located between the first flexible substrate 1 and the second flexible substrate 2 that are stacked; the plurality of first data lines 3 are distributed in the display region 100; the display panel further includes a plurality of pixel drive circuits 4 and a plurality of second data lines 5 located in the display region 100, and the plurality of pixel drive circuits 4 and the plurality of second data lines 5 are located on a side of the second flexible substrate 2 facing away from the first data lines 3; the plurality of pixel drive circuits 4 are arranged in an array; the plurality of first data lines 3 are connected with the plurality of second data lines 5 in one-to-one correspondence; among them, a pixel drive circuit 4 includes a drive transistor, and orthographic projections of the plurality of first data lines 3 on the first flexible substrate 1 are not overlapped with an orthographic projection of a channel region of the drive transistor on the first flexible substrate 1.

In the embodiment, the display panel may be an organic electroluminescent display panel. The display panel includes a plurality of light emitting units, which may be Organic Light Emitting Diode (OLED) light emitting units. In some embodiments, the OLED light emitting units are of a top emission type, and the pixel drive circuits 4 are distributed within the whole display region 100. A pixel drive circuit 4 may be a 7T1C (i.e., seven transistors and one capacitor) circuit, a 7T2C circuit, a 6T1C circuit, a 6T2C circuit, or a 9T2C circuit.

The orthographic projections of the plurality of first data lines 3 on the first flexible substrate 1 are not overlapped with the orthographic projection of the channel region of the drive transistor on the first flexible substrate 1, so that the first data lines 3 may be prevented from routing irregularly under the channel region of the drive transistor, thereby avoiding unevenness of the channel region of the drive transistor, thereby avoiding a change of a width-length ratio of the channel region of the drive transistor, avoiding a change of a drive current of the drive transistor, and finally avoiding a mura defect during display, thus ensuring quality of the display panel.

In some embodiments, referring to FIGS. 4 and 8, the display region 100 includes a first region 101 and a second region 102, and the first region 101 and the second region 102 are connected; a plurality of first data lines 3 extend from the first region 101 to the second region 102; the display panel further includes a non-display region, the non-display region includes a bending region 103, the bending region 103 is located on a side of the first region 101 away from the second region 102, the bending region 103, the first region 101, and the second region 102 are arranged in sequence along a second direction Y; the second direction Y is a column direction of the pixel drive circuit array; the first region 101 includes a first sub-region 104, a second sub-region 105, and a third sub-region 106, and the first sub-region 104, the second sub-region 105, and the third sub-region 106 are sequentially arranged along a first direction X and connected with each other; the first direction X is a row direction of the pixel drive circuit array; the bending region 103 is connected with the second sub-region 105; the first flexible substrate 1, the plurality of first data lines 3, and the second flexible substrate 2 extend from the second sub-region 105 to the bending region 103; the plurality of first data lines 3 within the second sub-region 105 include a first portion 31, a second portion 32, and a third portion 33; the first portion 31, the second portion 32, and the third portion 33 are arranged in sequence along the first direction X; the first portion 31 extends from the second sub-region 105 to the first sub-region 104, the third portion 33 extends from the second sub-region 105 to the third sub-region 106, and the second portion 32 extends from the second sub-region 105 to the second region 102.

In the embodiment, the first portion 31, the second portion 32, and the third portion 33 each include a plurality of first data lines 3. Only two first data lines 3 in the first portion 31, two first data lines 3 in the second portion 32, and two first data lines 3 in the third portion 33 are schematically depicted in FIG. 4. Two first data lines 3 in the first portion 31, the second portion 32, and the third portion 33 can representatively illustrate directions and distribution of first data lines 3 in each portion.

Among them, since a connection width of the bending region 103 with the first region 101 is smaller than a connection width of the first region 101 with the bending region 103, a plurality of first data lines 3 accessed from the bending region 103 to the first region 101 are routing in fan-shaped distribution (i.e., fanout distribution, i.e., divergent distribution like a bell mouth), and when the plurality of first data lines 3 are routing from the first region 101 to the second region 102, they are diffused from the fan-shaped distribution to uniform distribution. The plurality of first data lines 3 distributed in the first region 101 achieve that fan-shaped traces are distributed within the display region 100. Compared with a case where fan-shaped traces are distributed in a border region in a disclosed technology, a width of the border region is greatly reduced, which is beneficial to achieving an extremely narrow border.

In the embodiment, the display region 100 is composed of the first region 101 and the second region 102. Compared with a case where fan-shaped traces are distributed in a partial region of the display region in FIG. 1*a*, a plurality of first data lines 3 are distributed on an entire surface of the display region 100, thereby avoiding uneven traces caused by fan-shaped traces only distributed in the partial region of the display region, improving uniformity of distribution of fan-shaped traces within the display region 100, and thereby improving a display effect of the display panel.

Figure 9:
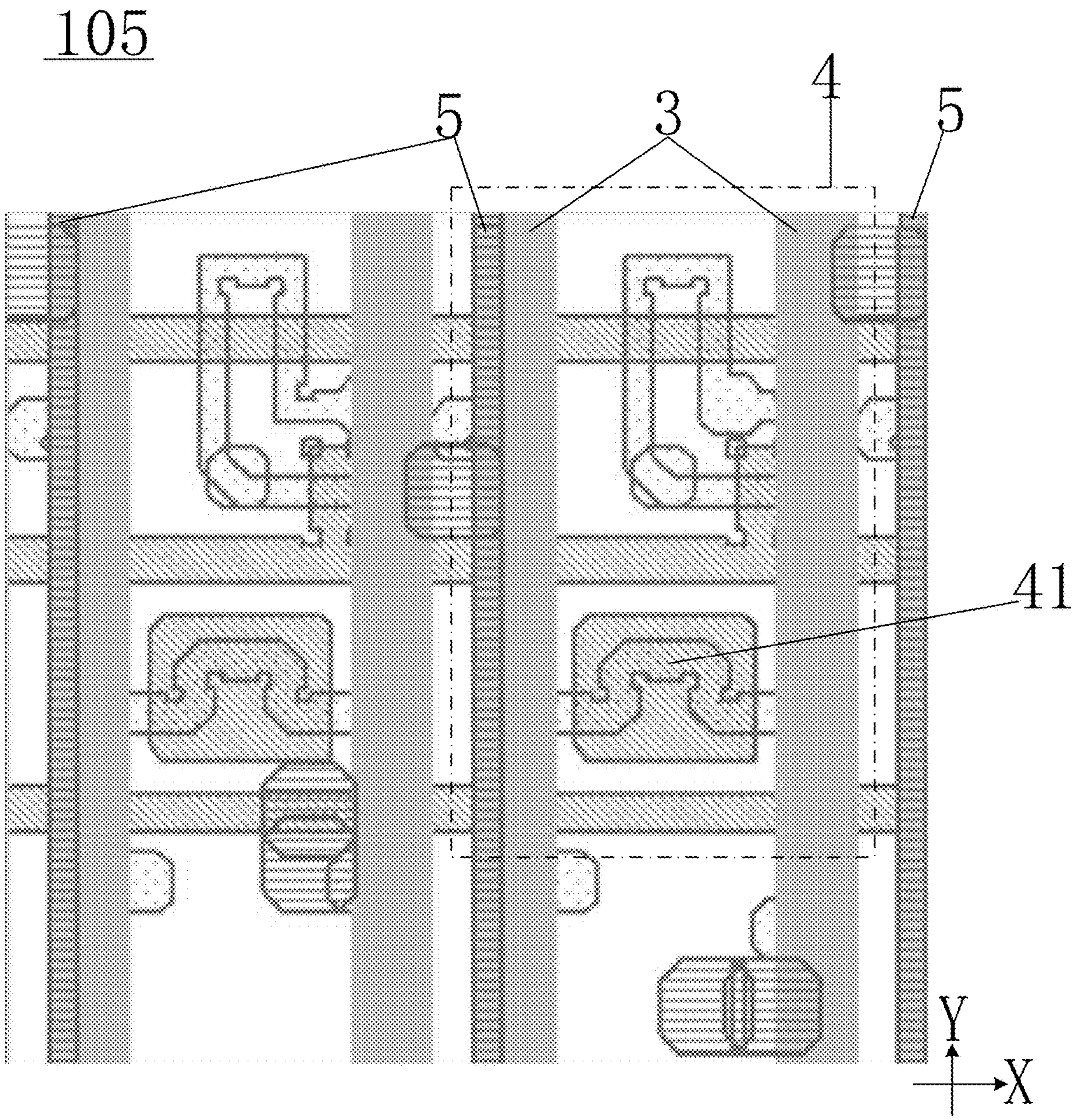
FIG. 9 is a schematic top view of distribution of first data lines within a second sub-region in an embodiment of the present disclosure.

In some embodiments, referring to FIG. 9, which is a schematic top view of distribution of first data lines within a second sub-region in an embodiment of the present disclosure; setting positions of drive transistors in a plurality of pixel drive circuits are the same; the first portion 31, the second portion 32, and the third portion 33 distributed within the second sub-region 105 extend along the second direction Y, and any two adjacent first data lines 3 are symmetrically distributed on opposite sides of a channel region 41 of a drive transistor; within the second sub-region 105, two first data lines 3 are distributed within a region of an orthographic projection of any one pixel drive circuit on the first flexible substrate.

In some embodiments, the region of the orthographic projection of the pixel drive circuit on the first flexible substrate includes a region enclosed by two adjacent gate lines and two adjacent second data lines 5, and orthographic projections of the two adjacent second data lines 5 on the first flexible substrate may also fall within the region of the orthographic projection of the pixel drive circuit.

In some embodiments, symmetrical distribution means that setting positions of two first data lines 3 are symmetrical. Due to a limitation of a preparation process, the symmetrical distribution includes not only physical symmetrical arrangement of patterns of two first data lines 3, but also a situation of incomplete physical symmetry of patterns of two first data lines 3.

Figure 10:
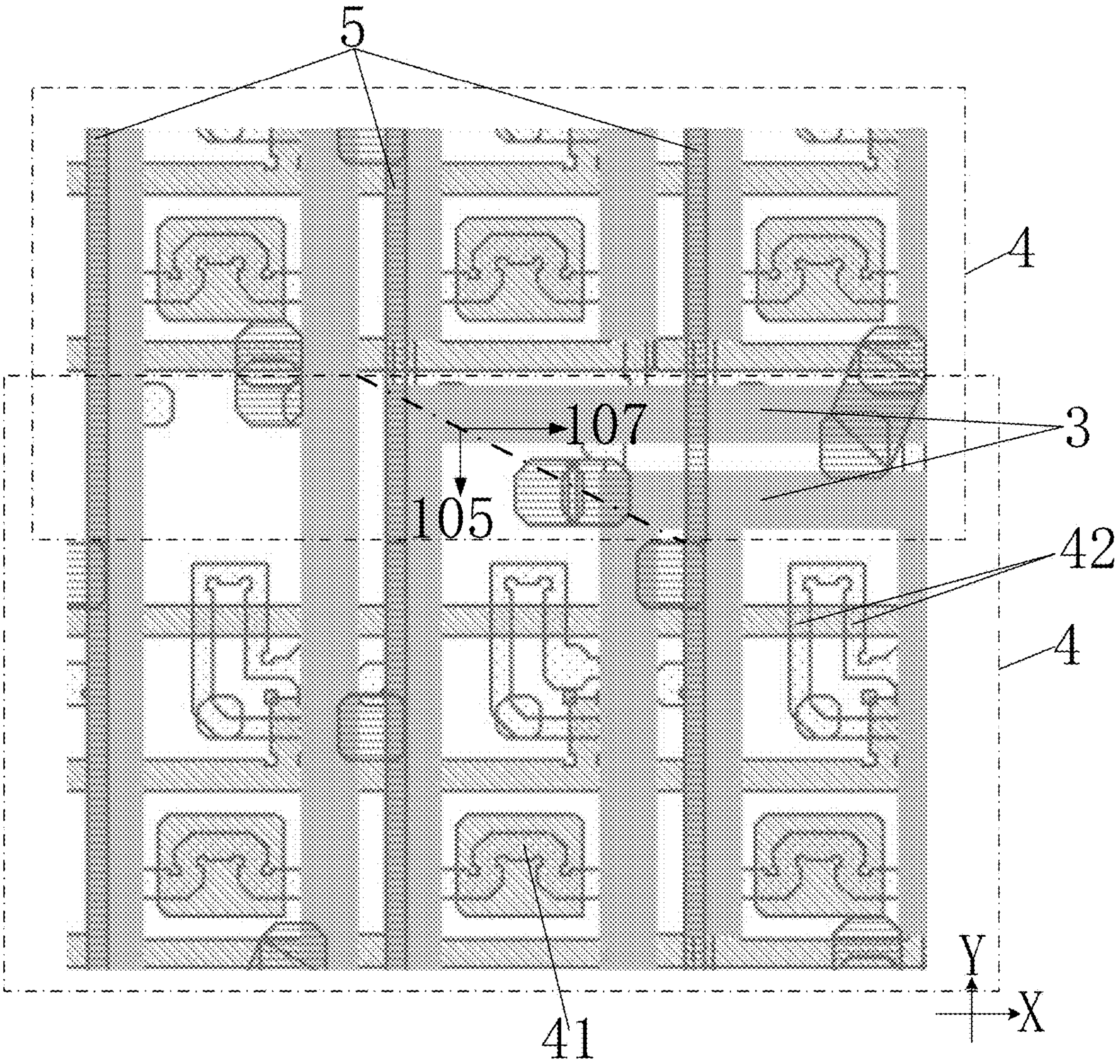
FIG. 10 is an enlarged schematic diagram of a first data line of a third portion extending and being distributed to a first partition in an embodiment of the present disclosure.

In some embodiments, referring to FIGS. 4 and 5, the first sub-region 104 includes a first partition 107 and a second partition 108; the third sub-region 106 includes a first partition 107 and a second partition 108; the first partition 107 and the second partition 108 are sequentially arranged along the first direction X and connected with each other; the second partition 108 is located on a side of the first partition 107 away from the second sub-region 105; the first portion 31 extends and is distributed to the first partition 107 of the first sub-region 104; referring to FIG. 10, which is an enlarged schematic diagram of the third portion extending and being distributed to the first partition in an embodiment of the present disclosure; the third portion 33 extends and is distributed to the first partition 107 of the third sub-region 106; the first portion 31 includes a plurality of first data lines 3; the third portion 33 includes a plurality of first data lines 3.

Figure 11:
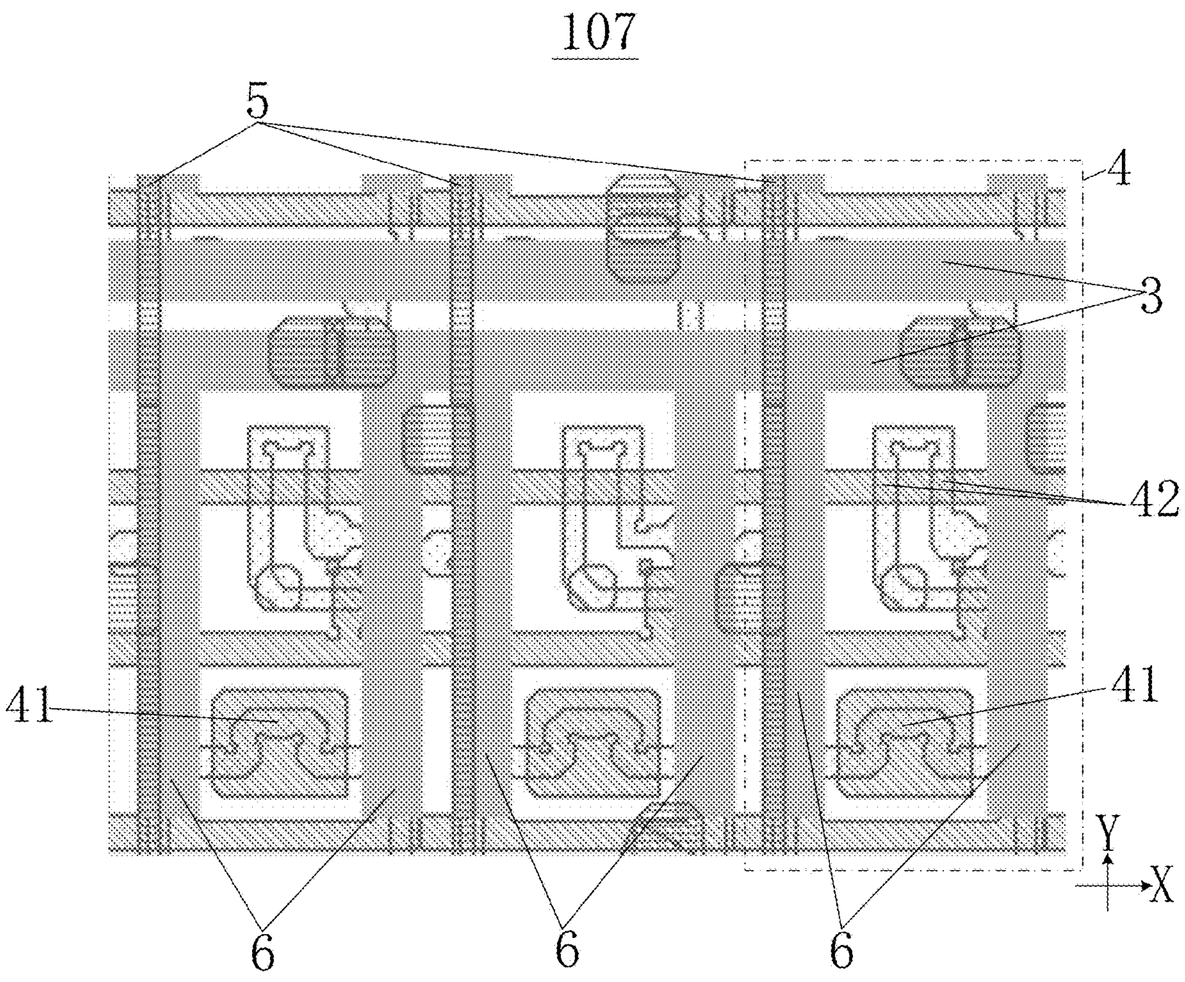
FIG. 11 is a schematic top view of distribution of first data lines within a first partition in an embodiment of the present disclosure.

In some embodiments, referring to FIGS. 10 and 11, FIG. 11 is a schematic top view of distribution of first data lines within the first partition in an embodiment of the present disclosure; extension directions of first data lines 3 located in different partitions are different, for example, the first portion and the third portion distributed within the first partition 107 extend along the first direction X, and a first data line 3 is located between two adjacent rows of pixel drive circuits 4; within the first partition 107, two first data lines 3 are distributed between any two adjacent rows of pixel drive circuits 4; and an orthographic projection of a first data line 3 and an orthographic projection of a channel region 42 of a switching transistor in a pixel drive circuit 4 on the first flexible substrate are not overlapped.

Figure 12:
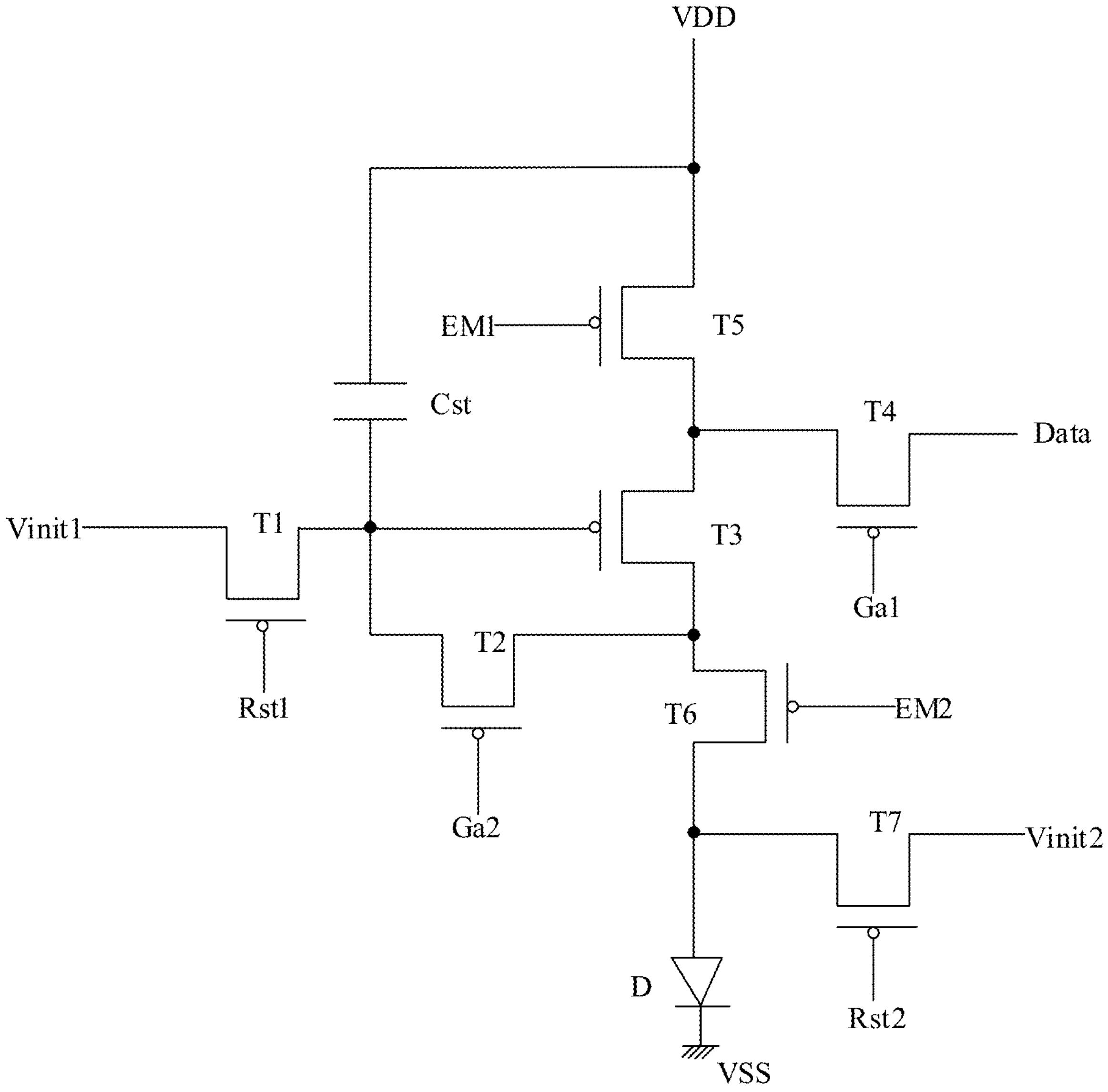
FIG. 12 is a circuit diagram of an exemplary pixel drive circuit.

In some embodiments, if a pixel drive circuit is a 7T1C circuit, referring to FIG. 12, which is a circuit diagram of an exemplary pixel drive circuit; the pixel drive circuit includes a first reset transistor T1, a threshold compensation transistor T2, a drive transistor T3, a data writing transistor T4, a first light emitting control transistor T5, a second light emitting control transistor T6, a second reset transistor T7, and a storage capacitor Cst. A drain of the data writing transistor T4 is electrically connected with a source of the drive transistor T3, a source of the data writing transistor T4 is configured to be electrically connected with a data line Data (i.e., a second data line in the embodiment of the present disclosure) to receive a data signal, and a gate of the data writing transistor T4 is configured to be electrically connected with a first scan signal line Ga1 to receive a scan signal; a second electrode plate of the storage capacitor Cst is electrically connected with a first power supply voltage line VDD, and a first electrode plate of the storage capacitor Cst is electrically connected with a gate of the drive transistor T3; a source of the threshold compensation transistor T2 is electrically connected with the gate of the drive transistor T3, a drain of the threshold compensation transistor T2 is electrically connected with a drain of the drive transistor T3, and the gate of the threshold compensation transistor T2 is configured to be electrically connected with a second scan signal line Ga2 to receive a compensation control signal; a source of the first reset transistor T1 is configured to be electrically connected with a first reset power supply terminal Vinit1 to receive a first reset signal, a drain of the first reset transistor T1 is electrically connected with the gate of the drive transistor T3, and a gate of the first reset transistor T1 is configured to be electrically connected with a first reset control signal line Rst1 to receive a first reset control signal; a drain of the second reset transistor T7 is configured to be electrically connected with a second reset power supply terminal Vinit2 to receive a first reset signal, a source of the second reset transistor T7 is electrically connected with a first electrode of a light emitting unit D, and a gate of the second reset transistor T7 is configured to be electrically connected with a second reset control signal line Rst2 to receive a second reset control signal; a source of the first light emitting control transistor T5 is electrically connected with a first power supply voltage line VDD, a drain of the first light emitting control transistor T5 is electrically connected with the source of the drive transistor T3, and a gate of the first light emitting control transistor T5 is configured to be electrically connected with a first light emitting control signal line EM1 to receive a first light emitting control signal; a source of the second light emitting control transistor T6 is electrically connected with the drain of the drive transistor T3, a drain of the second light emitting control transistor T6 is electrically connected with the first electrode D1 of the light emitting unit D, and a gate of the second light emitting control transistor T6 is configured to be electrically connected with a second light emitting control signal line EM2 to receive a second light emitting control signal; a second electrode of the light emitting unit D is electrically connected with a second power supply terminal VSS (i.e., a reference power supply trace in the embodiment of the present disclosure).

Among them, the first reset transistor T1, the threshold compensation transistor T2, the data writing transistor T4, the first light emitting control transistor T5, the second light emitting control transistor T6, and the second reset transistor T7 are all switching transistors.

In some embodiments, if a pixel drive circuit 4 is a 7T1C circuit, switching transistors in the pixel drive circuit 4 may refer to a first reset transistor T1, a threshold compensation transistor T2, a data write transistor T4, a first light emitting control transistor T5, a second light emitting control transistor T6, and a second reset transistor T7. Channel regions 42 of the first reset transistor T1, the threshold compensation transistor T2, the first light emitting control transistor T5, and the second light emitting control transistor T6 are located at positions close to junction regions of pixel drive circuit 4 of two adjacent rows, therefore, a case where an orthographic projection of a first data line 3 and orthographic projections of channel regions 42 of switching transistors T5, T6, T1, and T2 in the pixel drive circuit 4 on the first flexible substrate are overlapped is avoided as much as possible. An orthographic projection of a first data line 3 and an orthographic projection of a channel region 42 of a switching transistor in the pixel drive circuit 4 on the first flexible substrate are not overlapped, so that the first data line 3 may be prevented from routing irregularly under the channel region 42 of the switching transistor, thereby avoiding unevenness of the channel region 42 of the switching transistor, thereby avoiding a change of a width-length ratio of the channel region 42 of the switching transistor, thereby avoiding a change of switching performance of the switching transistor, and finally avoiding lighting of the display panel when the drive transistor does not perform threshold compensation and a mura defect appearing when the display panel is lit for testing, thus ensuring quality of the display panel.

In some embodiments, referring to FIG. 11, the display panel further includes a plurality of redundant traces 6 located within the first partition 107 and arranged in an array; the plurality of redundant traces 6 extend along the second direction Y, and any two adjacent redundant traces 6 along the first direction X are symmetrically distributed on opposite sides of a channel region 41 of a drive transistor; within the first partition 107, two redundant traces 6 are distributed within a region of an orthographic projection of any one pixel drive circuit 4 on the first flexible substrate; each row of redundant traces 6 is connected with one first data line 3 extending along the first direction X; an orthographic projection of each row of redundant traces 6 and an orthographic projection of another first data line 3 extending along the first direction X on the first flexible substrate are not overlapped; a length of each of the redundant traces 6 does not exceed a length, along the second direction Y, of a region of an orthographic projection of a pixel drive circuit 4 on the first flexible substrate.

In some embodiments, a first data line 3 within the first partition 107 is a horizontal trace extending along the first direction X, and the first data line 3 horizontally routing within the first partition 107 is perpendicular to a first data line 3 extending along the second direction Y vertically routing within the second sub-region 105, which may result in a phenomenon of uneven routing of first data lines 3 appearing on overall sense of the first region 101; by disposing redundant traces 6 within the first partition 107, that is, adding vertical redundant traces 6 on a basis of horizontal traces within the first partition 107, the phenomenon of uneven routing on the overall sense of the first region 101 can be weakened. Redundant traces 6 are similar to traces of the second sub-region 105, and similarly avoid a channel region 41 of a drive transistor, and are symmetrically distributed on opposite sides of the channel region 41 of the drive transistor, thereby avoiding a mura defect during a lighting test. Each row of redundant traces 6 is connected with one first data line 3 extending along the first direction X to prevent signal crosstalk to the first data line 3 when the redundant traces 6 are suspended.

Figure 13:
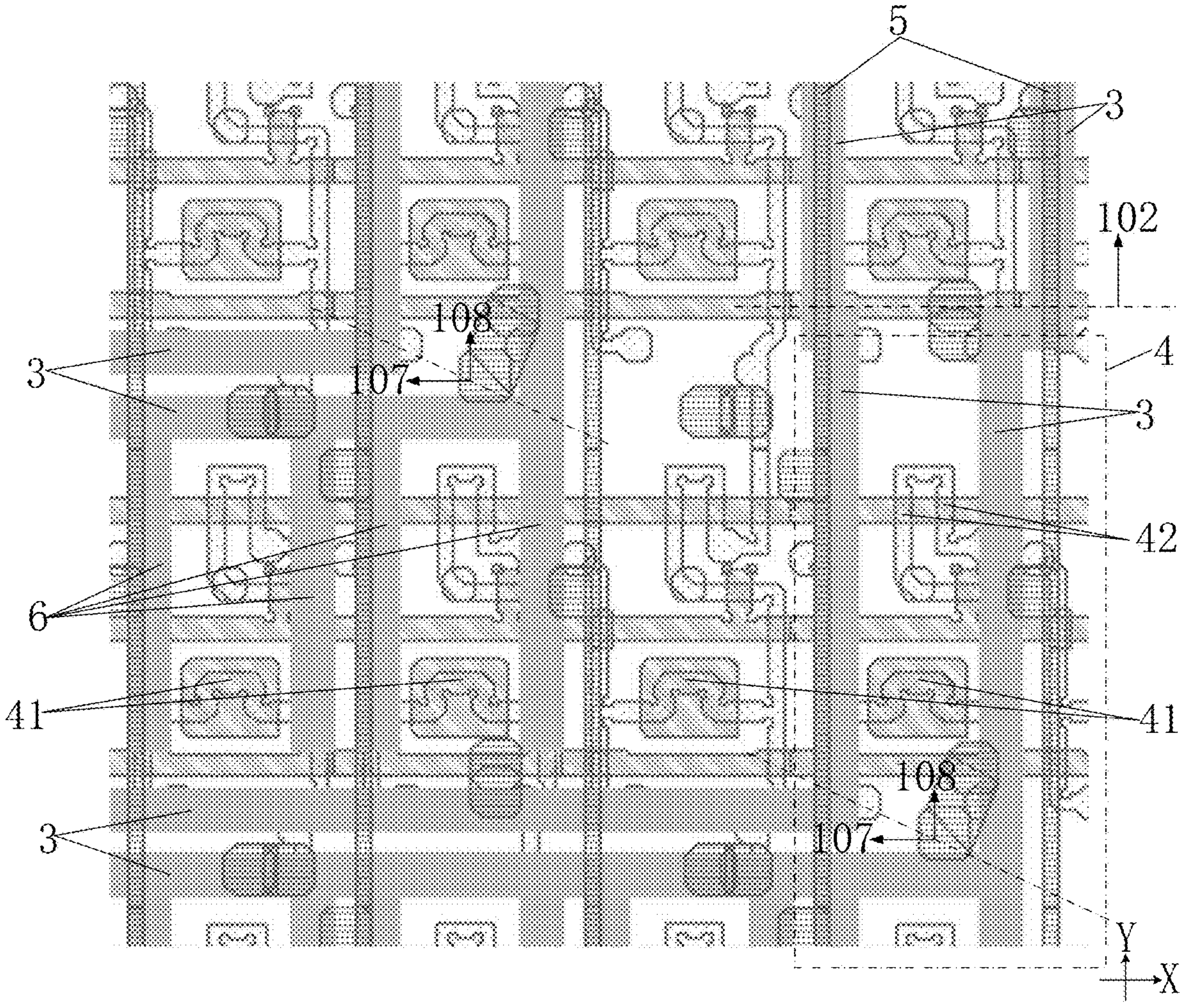
FIG. 13 is a schematic top view of distribution of first data lines of a third portion within a second partition in an embodiment of the present disclosure.

In some embodiments, referring to FIGS. 4, 5, and 13, FIG. 13 is a schematic top view of distribution of first data lines of the third portion within the second partition in an embodiment of the present disclosure; the first portion 31 also extends and is distributed to the second partition 108 of the first sub-region 104; the third portion 33 also extends and is distributed to the second partition 108 of the third sub-region 106.

In some embodiments, the first portion 31 and the third portion 33 distributed within the second partition 108 extend along the second direction Y, and along the first direction X, any two adjacent first data lines 3 are symmetrically distributed on opposite sides of a channel region 41 of a drive transistor; within the second partition 108, two first data lines 3 are distributed within a region of an orthographic projection of any one pixel drive circuit 4 on the first flexible substrate.

In some embodiments, referring to FIGS. 4 and 13, a width of a connection part of the first region 101 and the second region 102 is equal to a width of the second region 102 along the first direction X; the first portion 31 also extends and is distributed to the second region 102; the third portion 33 also extends and is distributed to the second region 102.

In some embodiments, the first portion 31, the second portion 32, and the third portion 33 distributed within the second region 102 are arranged in sequence along the first direction X, and the first portion 31, the second portion 32, and the third portion 33 respectively extend along the second direction Y; a plurality of second data lines 5 are sequentially arranged along the first direction X, and a plurality of second data lines 5 extend along the second direction Y; within the second region 102, one first data line 3 is distributed within a region of an orthographic projection of any one pixel drive circuit 4 on the first flexible substrate; orthographic projections of a plurality of first data lines 3 and a plurality of second data lines 5 on the first flexible substrate are overlapped in one-to-one correspondence. This facilitates a connection between a first data line 3 located in a lower layer and a second data line 5 located in an upper layer.

In some embodiments, since a plurality of first data lines 3 within the first region 101 are distributed in a fan shape, a distribution density of the first data lines 3 within the first region 101 is greater than a distribution density of first data lines 3 within the second region 102.

Figure 14:
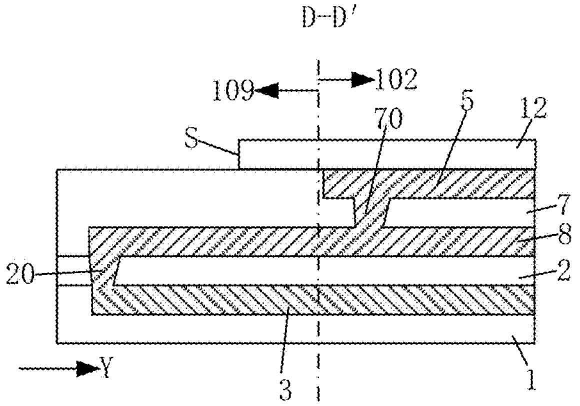
FIG. 14 is a sectional view of a structure taken along a section line DD' in FIG. 4.

In some embodiments, with reference to FIGS. 4 and 14, FIG. 14 is a sectional view of a structure taken along a section line DD' in FIG. 4; the non-display region further includes an upper frame region 109 located on a side of the second region 102 away from the first region 101, and the upper frame region 109 is connected with the second region 102; the first flexible substrate 1, a plurality of first data lines 3, and the second flexible substrate 2 also extend from the second region 102 to the upper frame region 109; a pixel drive circuit 4 includes a first conductive layer and a second conductive layer that are disposed sequentially away from the second flexible substrate 2; an insulation layer 7 is disposed between the first conductive layer and the second conductive layer; the first conductive layer includes a plurality of first patterns 8, and orthographic projections of first patterns 8 on the first flexible substrate 1 extend from the upper frame region 109 to the second region 102; a plurality of first data lines 3 located within the upper frame region 109 are respectively connected with a plurality of first patterns 8 in one-to-one correspondence through first vias 20 opened in the second flexible substrate 2; the second conductive layer includes a plurality of second data lines 5; a plurality of first patterns 8 located within the second region 102 are respectively connected with a plurality of second data lines 5 in one-to-one correspondence through second vias 70 opened in the insulation layer 7. Thus, whole surface arrangement of a plurality of first data lines 3 within the display region 100 is achieved, thereby improving distribution uniformity of the plurality of first data lines 3 within the display region 100, and further improving a display effect of the display panel.

In some embodiments, the first conductive layer further includes a plurality of second patterns (not shown in the figure) located in the display region, the plurality of second patterns are respectively used as one electrode plate of a storage capacitor in each pixel drive circuit; an orthographic projection of a second pattern and orthographic projections of a plurality of first data lines on the first flexible substrate are not overlapped.

In some embodiments, a pixel drive circuit includes an active layer, a first gate layer, a first conductive layer, and a second conductive layer, wherein the active layer, the first gate layer, the first conductive layer, and the second conductive layer are sequentially disposed away from the second flexible substrate, and any two adjacent ones are insulated from each other through an inorganic insulation layer. The active layer includes patterns of a channel region of a drive transistor and a channel region of a switching transistor; the first gate layer includes patterns of a gate line, a gate of the drive transistor, and a gate of the switching transistor; among them, the gate of the drive transistor is used as one electrode plate of a storage capacitor in the pixel drive circuit; the first conductive layer includes a first pattern 8 and a second pattern, wherein the second pattern serves as another electrode plate of the storage capacitor in the pixel drive circuit, i.e., an orthographic projection of the second pattern and an orthographic projection of the gate of the drive transistor on the first flexible substrate are overlapped, and the second pattern and the gate of the drive transistor constitute the storage capacitor. The second conductive layer includes patterns of a plurality of second data lines 5 and patterns of sources and drains of the drive transistor and the switching transistor in the pixel drive circuit.

In some embodiments, with reference to FIGS. 4 and 14, the display panel further includes a plurality of light emitting units and an encapsulation layer 12, the plurality of light emitting units are located in the display region 100 and located on a side of the pixel drive circuit away from the second flexible substrate; the plurality of light emitting units are arranged in an array, and the plurality of light emitting units are connected with a plurality of pixel drive circuits in one-to-one correspondence; the encapsulation layer 12 is located on a side of a light emitting unit away from the pixel drive circuit and is used for encapsulating the light emitting unit; an upper boundary S of the encapsulation layer 12 is located in the upper frame region 109; an orthographic projection of a first via 20 and an orthographic projection of the encapsulation layer on the first flexible substrate are not overlapped. That is, the first via 20 is located outside the upper boundary S of the encapsulation layer.

In some embodiments, the light emitting unit is an organic electroluminescent unit, i.e., an Organic Light Emitting Diode (OLED) light emitting unit.

In the display panel provided by the embodiment of the present disclosure, an orthographic projection of at least a part of a plurality of first data lines routing along a column direction of a pixel drive circuit array on the first flexible substrate is not overlapped with an orthographic projection of a channel region of a drive transistor on the first flexible substrate, so that irregular routing of the first data lines under the channel region of the drive transistor can be improved or avoided, thereby improving or avoiding unevenness of the channel region of the drive transistor, thereby improving or avoiding a change of a width-length ratio of the channel region of the drive transistor so as to improve or avoid a change of a drive current of the drive transistor, and finally improving or avoiding lighting of the display panel when the drive transistor does not perform threshold compensation and a mura defect appearing when the display panel is lit for testing, thus ensuring quality of the display panel.

In a second aspect, an embodiment of the present disclosure also provides a display apparatus, including the display panel in the above embodiment.

By adopting the display panel in the above embodiment, a mura defect appearing in a lighting test of the display apparatus can be avoided, thereby ensuring quality of the display apparatus.

The display apparatus may be any product or component with a display function, such as an OLED panel, an OLED television, a mobile phone, a tablet computer, a laptop computer, a monitor, a digital photo frame, and a navigator.

It may be understood that above implementation modes are only exemplary implementation modes adopted for explaining principles of the present disclosure, however the present disclosure is not limited thereto. For those of ordinary skills in the art, various variations and improvements may be made without departing from the spirit and essence of the present disclosure, and these variations and improvements are also regarded as the protection scope of the present disclosure.

The invention claimed is:

1. A display panel, comprising a display region;

wherein the display panel further comprises a first flexible substrate, a second flexible substrate, and a plurality of first data lines, the plurality of first data lines are located between the first flexible substrate and the second flexible substrate that are stacked; the plurality of first data lines are distributed in the display region;

the display panel further comprises a plurality of pixel drive circuits and a plurality of second data lines located in the display region, and the plurality of pixel drive circuits and the plurality of second data lines are located on a side of the second flexible substrate facing away from the first data lines;

the plurality of pixel drive circuits are arranged in an array; the plurality of first data lines are connected with the plurality of second data lines in one-to-one correspondence;

wherein the plurality of first data lines comprise a part routing along a column direction of the pixel drive circuit array, the pixel drive circuit comprise drive transistors, and an orthographic projection of at least the part of the plurality of first data lines routing along the column direction of the pixel drive circuit array on the first flexible substrate is not overlapped with an orthographic projection of channel regions of the drive transistors on the first flexible substrate.

2. The display panel according to claim 1, wherein the display region comprises a first region and a second region, and the first region and the second region are connected;

the display panel further comprises a non-display region, the non-display region comprises a bending region located on a side of the first region away from the second region, the bending region, the first region, and the second region are arranged in sequence along a second direction; the second direction is the column direction of the pixel drive circuit array;

the first region comprises a first sub-region, a second sub-region, and a third sub-region, wherein the first sub-region, the second sub-region, and the third sub-region are sequentially arranged along a first direction and connected with each other; the first direction is a row direction of the pixel drive circuit array;

the bending region is connected with the second sub-region;

the first flexible substrate, the plurality of first data lines, and the second flexible substrate extend from the second sub-region to the bending region;

the plurality of first data lines within the second sub-region comprises a first portion, a second portion, and a third portion; the first portion, the second portion, and the third portion are arranged in sequence along the first direction;

the first portion extends and is distributed from the second sub-region to the first sub-region, the third portion extends and is distributed from the second sub-region to the third sub-region, and the second portion extends and is distributed from the second sub-region to the second region.

3. The display panel according to claim 2, wherein the first portion, the second portion, and the third portion distributed within the second sub-region extend along the second direction, and any two adjacent first data lines are symmetrically distributed on opposite sides of a channel region of one of the drive transistors;

within the second sub-region, two of the first data lines are distributed within a region of an orthographic projection of any one of the pixel drive circuits on the first flexible substrate.

4. The display panel according to claim 3, wherein the first sub-region comprises a first partition and a second partition; the third sub-region comprises a first partition and a second partition;

the first partition and the second partition are sequentially arranged along the first direction and connected with each other; the second partition is located on a side of the first partition away from the second sub-region;

the first portion extends and is distributed to the first partition of the first sub-region;

the third portion extends and is distributed to the first partition of the third sub-region;

the first portion comprises a plurality of the first data lines;

the third portion comprises a plurality of the first data lines.

5. The display panel according to claim 4, wherein the first portion and the third portion distributed within the first partition extend along the first direction, and the first data lines are located between two adjacent rows of the pixel drive circuits;

within the first partition, two of the first data lines are distributed between any two adjacent rows of the pixel drive circuits; and an orthographic projection of the first data lines and an orthographic projection of channel regions of switching transistors in the pixel drive circuits on the first flexible substrate are not overlapped.

6. The display panel according to claim 5, further comprising a plurality of redundant traces which are located within the first partition and arranged in an array;

the plurality of redundant traces extend along the second direction, and any two adjacent redundant traces along the first direction are symmetrically distributed on opposite sides of a channel region of one of the drive transistors;

within the first partition, two of the redundant traces are distributed within a region of an orthographic projection of any one of the pixel drive circuits on the first flexible substrate;

each row of the redundant traces is connected with one of the first data lines extending along the first direction; an orthographic projection of each row of the redundant traces and an orthographic projection of other first data lines extending along the first direction on the first flexible substrate are not overlapped;

a length of each of the redundant traces does not exceed a length of a region of an orthographic projection of a pixel drive circuit on the first flexible substrate along the second direction.

7. The display panel according to claim 4, wherein the first portion further extends and is distributed to the second partition of the first sub-region;

the third portion further extends and is distributed to the second partition of the third sub-region.

8. The display panel according to claim 7, wherein the first portion and the third portion distributed within the second partition extend along the second direction, and any two adjacent first data lines along the first direction are symmetrically distributed on opposite sides of a channel region of one of the drive transistors;

within the second partition, two of the first data lines are distributed within a region of an orthographic projection of any one of the pixel drive circuits on the first flexible substrate.

9. The display panel according to claim 7, wherein a width of a connection part of the first region and the second region is equal to a width of the second region along the first direction;

the first portion further extends and is distributed to the second region;

the third portion further extends and is distributed to the second region.

10. The display panel according to claim 9, wherein the first portion, the second portion, and the third portion distributed within the second region are sequentially arranged along the first direction, and the first portion, the second portion, and the third portion respectively extend along the second direction;

the plurality of second data lines are sequentially arranged along the first direction, and the plurality of second data lines extend along the second direction;

within the second region, one of the first data lines is distributed within a region of an orthographic projection of any one of the pixel drive circuits on the first flexible substrate; and orthographic projections of the plurality of first data lines and the plurality of second data lines on the first flexible substrate are overlapped in one-to-one correspondence.

11. The display panel according to claim 10, wherein the non-display region further comprises an upper frame region located on a side of the second region away from the first region, and the upper frame region is connected with the second region;

the first flexible substrate, the plurality of first data lines, and the second flexible substrate further extend from the second region to the upper frame region;

the pixel drive circuits comprise a first conductive layer and a second conductive layer, wherein the first conductive layer and the second conductive layer are sequentially disposed away from the second flexible substrate; an insulation layer is disposed between the first conductive layer and the second conductive layer;

the first conductive layer comprises a plurality of first patterns, and an orthographic projection of the plurality of first patterns on the first flexible substrate extends from the upper frame region to the second region;

the plurality of first data lines located within the upper frame region are respectively connected with the plurality of first patterns in one-to-one correspondence through first vias opened in the second flexible substrate;

the second conductive layer comprises the plurality of second data lines;

the plurality of first patterns located within the second region are respectively connected with the plurality of second data lines in one-to-one correspondence through second vias opened in the insulation layer.

12. The display panel according to claim 11, further comprising a plurality of light emitting units and an encapsulation layer, the plurality of light emitting units are located in the display region and on a side of the pixel drive circuits facing away from the second flexible substrate;

the plurality of light emitting units are arranged in an array, and the plurality of light emitting units are connected with the plurality of pixel drive circuits in one-to-one correspondence;

the encapsulation layer is located on a side of the light emitting units facing away from the pixel drive circuits, and is used for encapsulating the light emitting units;

an upper boundary of the encapsulation layer is located in the upper frame region;

an orthographic projection of the first vias and an orthographic projection of the encapsulation layer on the first flexible substrate are not overlapped.

13. The display panel according to claim 11, wherein the first conductive layer further comprises a plurality of second patterns located in the display region, and the plurality of second patterns are each used as one electrode plate of a storage capacitor in each of the pixel drive circuits;

an orthographic projection of the second patterns and an orthographic projection of the plurality of first data lines on the first flexible substrate are not overlapped.

14. A display apparatus, comprising a display substrate according to claim 1.

15. The display panel according to claim 5, wherein the first portion further extends and is distributed to the second partition of the first sub-region;

the third portion further extends and is distributed to the second partition of the third sub-region.

16. The display panel according to claim 6, wherein the first portion further extends and is distributed to the second partition of the first sub-region;

the third portion further extends and is distributed to the second partition of the third sub-region.

17. A display apparatus, comprising a display substrate according to claim 2.

18. A display apparatus, comprising a display substrate according to claim 3.

19. A display apparatus, comprising a display substrate according to claim 4.

20. A display apparatus, comprising a display substrate according to claim 5.

* * * * *